(12) United States Patent
Huang (10) Patent No.: US 11,844,258 B2
(45) Date of Patent: Dec. 12, 2023

(54) ORGANIC LIGHT-EMITTING DIODE DISPLAY PANEL AND DISPLAY APPARATUS

(71) Applicant: SeeYA Optronics Co., Ltd., Shanghai (CN)

(72) Inventor: Zhongshou Huang, Shanghai (CN)

(73) Assignee: SeeYA Optronics Co., Ltd., Shanghai (CN)

( * ) Notice: Subject to any disclaimer, the term of this patent is extended or adjusted under 35 U.S.C. 154(b) by 303 days.

(21) Appl. No.: 17/162,114

(22) Filed: Jan. 29, 2021

(65) Prior Publication Data
US 2022/0085112 A1   Mar. 17, 2022

(30) Foreign Application Priority Data
Sep. 15, 2020   (CN) .......................... 202010967723.4

(51) Int. Cl.
| H10K 59/38 | (2023.01) |
| H10K 50/86 | (2023.01) |
| H10K 59/122 | (2023.01) |
| H10K 59/173 | (2023.01) |

(52) U.S. Cl.
CPC .......... *H10K 59/38* (2023.02); *H10K 50/865* (2023.02); *H10K 59/122* (2023.02); *H10K 59/173* (2023.02)

(58) Field of Classification Search
CPC ............... H01L 27/322; H01L 51/5284; H01L 27/3246; H01L 27/3283
See application file for complete search history.

(56) References Cited

U.S. PATENT DOCUMENTS

| 2008/0158097 A1* | 7/2008 | Guo ........................ G09G 5/02 345/55 |
| 2016/0293678 A1* | 10/2016 | Wang ...................... H01L 27/12 |
| 2016/0329384 A1* | 11/2016 | Hou ....................... H10K 59/353 |
| 2019/0096971 A1* | 3/2019 | Ukigaya ............. H01L 51/5056 |
| 2020/0273924 A1* | 8/2020 | Xiao ....................... C23C 14/042 |
| 2020/0365665 A1* | 11/2020 | Choi ..................... H01L 27/3216 |

FOREIGN PATENT DOCUMENTS

CN   107229155 A   * 10/2017

* cited by examiner

*Primary Examiner* — Nduka E Ojeh
(74) *Attorney, Agent, or Firm* — W&G Law Group (57) ABSTRACT

The present disclosure relates to an OLED display panel including a substrate and a plurality of pixels located on the substrate. Each of the plurality of pixels includes a subpixel of a first color and at least two subpixels of different colors, wherein the subpixel of the first color emits light in a longest average wavelength among the other subpixels. The subpixel of the first color is guarded by subpixels of different colors in a manner that to maximize the distance from the subpixel of the first color to an adjacent pixel. Benefiting from these arrangements, color mixing and image blurring originated from optical diffraction effect particularly by long wavelength light are minimized.

17 Claims, 10 Drawing Sheets

ORGANIC LIGHT-EMITTING DIODE DISPLAY PANEL AND DISPLAY APPARATUS

CROSS-REFERENCE TO RELATED APPLICATIONS

The present application is based upon and claims the benefit of priority of Chinese Patent Application No. CN202010967723.4, filed on Sep. 15, 2020, the entire contents of which are incorporated herein by reference.

TECHNICAL FIELD

The present disclosure relates to the field of display panel technologies, and in particular, to an organic light-emitting diode display panel and a display apparatus.

BACKGROUND

After 6.5 million years of evolution, the human vision system has been naturally optimized to adapt to hunting and farming activities on the earth. For example, acquisition and handling of colors are achieved by combining physiological actions and psychological actions. Further, the spatial distribution of brightness is detected by hundreds of millions of light-sensitive optic nerve cells that are densely distributed on a retina. Colors of images are recognized by three types of cone cells on the retina, which are sensitive to red, green, and blue light, respectively. Contrast enhancement of images and tracking of moving objects are realized by performing differential processing of spatial distribution on signals intensity acquired by the optic nerve cells, e.g., the well-known Mach effect for enhancing edge contrast.

Almost all of electronic displays developed in recent 100 years have been designed and manufactured to mimic the functionalities or meet the requirements of human visual system. Therefore, various characteristic parameters of the electronic camera or displays, such as color, brightness, image refreshing frequency, spatial resolution, viewing angle, response speed, are ideally constructed to accommodate the structure and characteristics of the human vision system. However, a picture element such as a pixel in an electronic display, is not formed by a single light-emitting point source or a single reflection point source that emits or reflects light in different colors, like what a real object in nature such as an animal or a plant does. Instead, such a pixel is formed by three subpixels, which abut against each other and emit or reflect red, green and blue light, respectively. Two types of the electronic displays are developed so far: self-illumination display, and reflective display. They both use RGB subpixels to produce color images. The retina of human eyes contains nearly 125 million rod cells and nearly 7 million cone cells. The cone cells are densely distributed near the macula area that is most sensitive area in the retina, which mainly function to collect color signals with a relatively higher spatial resolution. The rod cells mainly function to acquire brightness signals with a relatively lower spatial resolution. Analysis of retinal slices by a scanning electron microscopy (SEM) has revealed that the cone cells and the rod cells generally have cross-sectional dimensions in a range of 3 μm to 10 μm, and the rod cells are smaller than the cone cells. Each cone cell is connected with an optic nerve linking to a vision processing region of human brain. However, each rod cell is further connected with multiple rod cells nearby to perform primary spatial correlation operations on images, and the results are then output to the vision processing portion of the human brain. Therefore, although there are a large number of rod cells with slightly smaller dimensions, the spatial resolution of the rod cells is lower than that of the cone cells.

In the electronic displays, dimension and quantity of subpixels in one color can be different from that of the subpixels in other colors. For example, since the human retina is most sensitive to green light in the range of 520 nm to 580 nm, more green subpixels used in the electronic displays will result in less power consumption and longer lifetime. As an alternative approach to reduce power consumption, W (white) subpixels, which output white light, are added into the pixel array of a smart phone display screen or a television display screen. A typical and most well-known example is Bayer color filter (CF) array, where red, green, and blue color filters and associated subpixels are arranged in a square grid matrix with a quantity ratio as: green pixels:red pixels:blue pixels equal to 50%: 25%: 25%. In another Bayer arrangement, the number of the blue subpixels is merely about one eighth of the total number of the subpixels, which imitates the human retina's low resolution for blue images. In other words, it will be a waste if one-third or one-fourth of the total subpixels are blue subpixels, and it is therefore preferable to assign more space of the display array to the green or red subpixels for better image resolution and brightness.

Fabricated by most advanced semiconductor technology, the displays and cameras in recent years have exceeded performance limits of the human eyes in some aspects, or even approached limits of some physical laws. For instance, an image sensor or a display panel with submicron subpixel can be readily produced with mature deep ultraviolet light in lithography, however image detail in submicron meter is theoretically impossible to be recognized or resolved by a visible light wave. Optical diffraction becomes a significant obstacle in this case.

In particular, 4K camera chips with ultra-high-resolution in single-lens reflex cameras and mobile phone cameras have been successfully developed and widely used in recent years, where the optical diffraction phenomenon has been firstly concerned and studied in the field of imaging technologies. On the display technology side, micro-display, which is mainly adopted in augmented reality (AR) or virtual reality (VR) applications, comprises subpixels in a dimension comparable to the wavelength of visible light, in order to obtain high resolution image on a miniaturized display panel. For example, micro-display formed by superimposing an organic light-emitting diode (OLED hereinafter) on a silicon chip, with subpixel size scaled down to 1 μm or even smaller, can be readily manufactured by using mature integrated circuit foundry processes, and the miniaturization trend will continue in the foreseeable future. Unfortunately, the detrimental effects of the optical diffraction in the micro-display associated with the miniaturization trend has not been well studied and fewer improvement in device structure is proposed.

The diffraction effect occurring on the image sensor can be corrected to some extent through subsequent image processing. For example, a point spread function of the diffraction effect of an optical waveform can be obtained in advance through measurement or computer simulation performed on an existing device, and then an input image without diffraction interference can be reconstructed by using an algorithm such as deconvolution. In other words, the structure of the image sensor is treated as a spatial light modulator, including functions for diffracting, reflecting, refracting and absorbing, and then an inverse operation is performed on the obtained image to retrieve the original input image. However, since the display provides a two-dimensional optical image for direct and real-time viewing, all the diffracted light components will enter the human eyes in real time together with a normal optical image, and therefore are unable to be separated or corrected.

Figure 1:
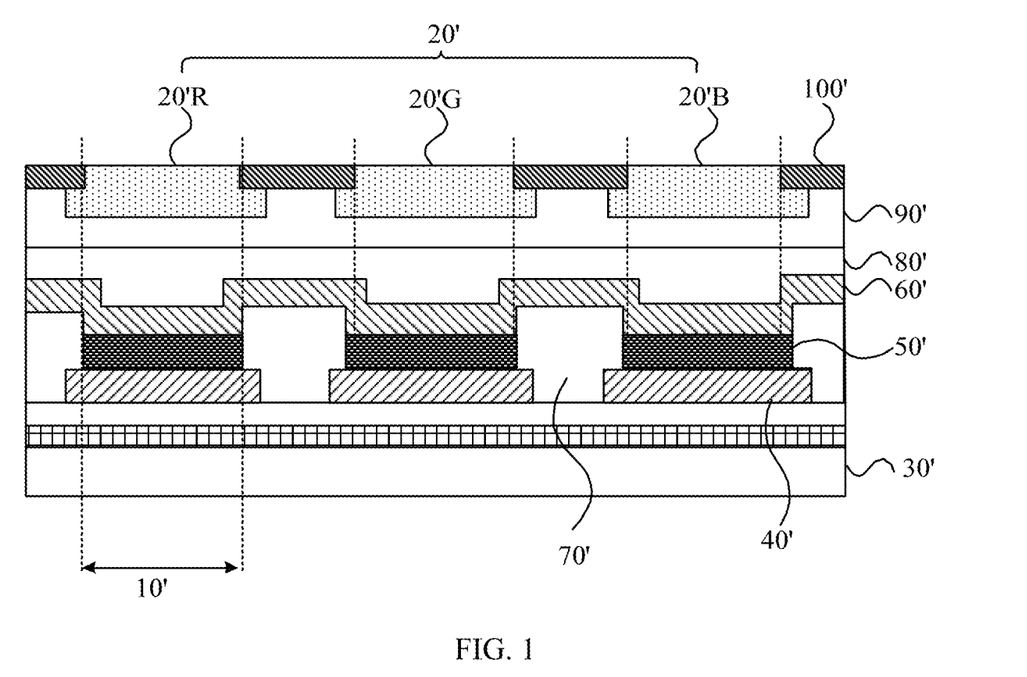
FIG. 1 illustrates a sectional view of a pixel in an OLED display panel in the related art.
Figure 2:
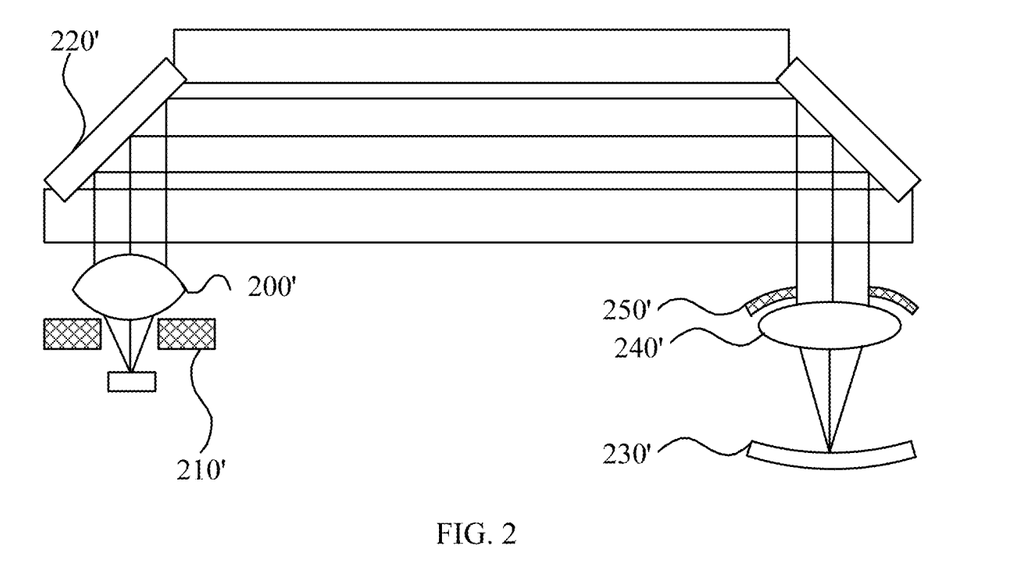
FIG. 2 illustrates a schematic view of an optical system in an AR glass.

FIG. 1 illustrates a cross-sectional view of a pixel in an OLED display panel in the related art, and FIG. 2 illustrates an optical system in an AR or VR glasses comprising an OLED display panel as illustrated in FIG. 1. Refer to FIG. 1, which is a micro optical system, a pixel includes three subpixels, R, G, and B, that each of the three subpixels includes an OLED 10' and a color filter 20'. For example, white lights are emitted by the OLED 10' and filtered by a red filter 20'R to allow only red light to pass through. A black matrix 30' is arranged around the red filter 20'R to block or absorb light emitted in large oblique angle. In other words, an opening of the black matrix 30' defines an output window or an aperture for the light emitted from the OLED 10'. According to the principle of diffractive optics, any slit or aperture which hinders propagation of the light waveform will cause wavefront interference and generate a transversely propagating diffractive waveform behind the slit or the aperture. In addition, diffraction becomes more severe for smaller slit or aperture and for longer wavelength light, that the diffraction occurring in the blue and green subpixels are less severe than that in the red subpixel. Further refer to the optical system illustrated in FIG. 2, which is a macro optical system comparing to the micro optical system described above, several optical components including a focusing lens 200', a diaphragm 210' of the lens system, and a reflector 220' are adopted to transmit an optical image from the OLED display to human retina 230'. In other circumstances where a slim and light weight AR glasses is essential, the optical images may be transmitted through an optical waveguide, such as a bundled optical fiber or a transparent sheet made of high refractive index material. In any of the above circumstances, for the purpose of miniaturization and lightweight of the optical system, a size of the focusing lens 200' and a size of the diaphragm 210' may be smaller than a size of the eye iris 250'. Optical diffraction may occur at a circular aperture of the diaphragm 210' as well.

Figure 3:
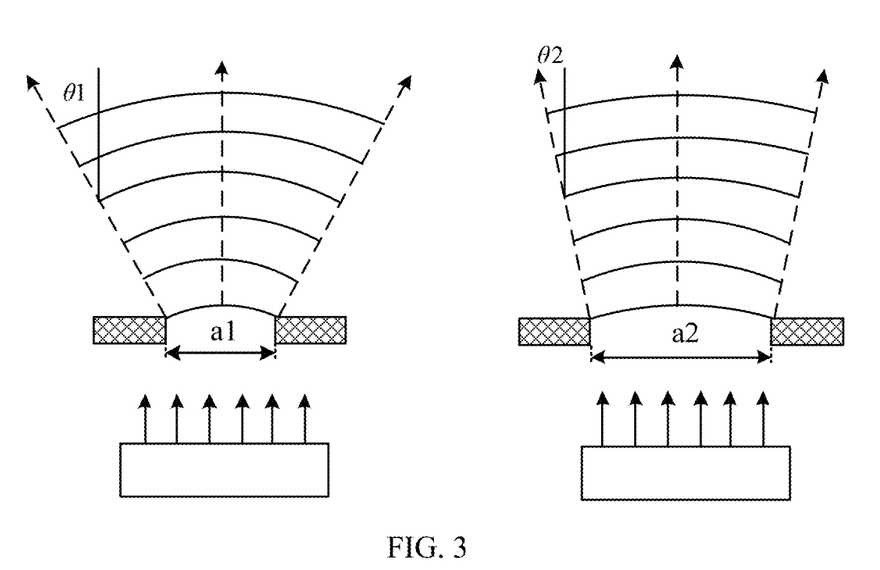
FIG. 3 illustrates a dependance between optical diffraction and dimension of aperture.

The optical diffractions at micro level and macro level as described above occur due to the same root cause that the light propagation is hindered by the aperture of the black matrix or the diaphragm, and therefore both follow the same diffraction law. One of the diffraction laws is illustrated in FIG. 3, where an aperture a1 is smaller than an aperture a2, and the resulting diffraction phenomenon measured by light spread angles satisfies: $\theta_1 > \theta_2$. For the optical diffractions, a diffraction occurring when a point light source passes through a circular aperture is referred to as Fresnel circular aperture diffraction, and a diffraction occurring when a parallel light beam passes through a circular aperture is referred to as Fraunhofer circular aperture diffraction. The light-emitting source in the OLED display panel is an array formed by pixelated planar light sources in a small area. Strictly speaking, neither the diffraction by an aperture of the black matrix nor the diffraction by the diaphragm of an imaging lens of the display panel are the Fraunhofer diffraction. However, in a spatial angular distribution of the light emitted by the OLED 10', where a light intensity in a normal direction of the OLED 10' surface is the highest, the diffraction of the display panel can be approximately simulated based on the Fraunhofer diffraction theory.

According to the Fraunhofer diffraction theory, a spread angle of a bright spot, i.e., an Airy disc, at a center of the diffraction pattern can be expressed by the following equation:

$$\theta = \arctan\left(\frac{1.22\lambda}{a}\right).$$

In the above equation, $\lambda$ denotes a wavelength of the light, and a denotes a light transmission aperture. As defined in this equation, when the spread angle of the Airy disc is relatively small, the spread angle of the Airy disc is approximately proportional to the wavelength, and is approximately inversely proportional to the diameter of the light transmission aperture. For example, for a black matrix with 2 µm opening, a green light with a wavelength of 0.55 µm has a spread angle of 19° after diffracted, while a red light with a wavelength of 0.7 µm has a 25° spread angle after diffracted. Further assuming that the subpixel has a 4 µm pitch, that is, a width of the black matrix between adjacent apertures is 2 µm, a diffracted light beam spreading in 25° after the black matrix aperture will be mixed with another diffracted light beam from adjacent subpixel after approximately 2 um propagation. Therefore, in the OLED display panel, when the subpixel size is in several micron meter scale, the transverse light diffusion resulting from the diffraction will cause serious signal crosstalk, resulting in image blurring and decreased color gamut.

It should be noted that, as shown in FIG. 1, each of the pixels manufactured on a silicon substrate 30' includes a red subpixel 10'R, a green subpixel 10'G and a blue subpixel 10'B that are arranged on the silicon substrate 30'. Each of the subpixels includes: a first electrode 40' typically used as an anode of an OLED; a pixel definition layer 70' configured to block transverse charge diffusion between adjacent subpixels; an OLED functional layer 50' typically formed by superimposing a plurality of thin films of different functions; a second electrode 60', which is typically used as a cathode of the OLED and is transparent to the visible light emitted by the OLED; an encapsulation layer 80' typically formed by superimposing a plurality of layers of silicon nitride-silicon oxide and configured to protect the OLED films against external moisture and oxygen; a planarization layer 90' configured to planarize an uneven surface of the device to reduce a deviation of an optical path of light passing through a color film and to eliminate light scattering caused by any unevenness between a cover glass and an OLED display screen; a color filter 20; and a black matrix 100' configured to absorb light having a large angle and block the light having a large angle from optically cross talking or color mixing with the adjacent subpixels. The white light, after emitted from OLEDs of the three subpixels on the silicon substrate, are filtered by the respective color filters 20', so that light of three colors, that are R, G, and B, are emitted from the OLED display panel. The black matrix 100' is typically arranged between the color filters 20' of different colors, so as to prevent the light emitted from the OLED film at the large angle from entering the adjacent subpixels after passing through the encapsulation film layer with a predetermined thickness and the planarization film layer with a predetermined thickness, resulting in the color mixing. According to the theory of geometrical optics, that is, based on the assumption that all of the light rays are emitted outwardly along a straight flight path, the black matrix is provided to prevent the color mixing. However, the black matrix will cause the Fraunhofer circular aperture diffraction when the opening size of the black matrix is close to the light wavelength. According to the above-described angle equation of a zero-order diffraction spot, i.e., the Airy disc, the size of the diffraction spot increases with the increase of the wavelength and with the reduction of the opening size. It should be noted that the wavelength in the above equation should be a wavelength in a medium where the diffraction occurs. For example, when the diffraction occurs in a color film substrate glass or a cover glass used for encapsulating the silicon-based OLED, the wavelength in the equation is equal to a result obtained by dividing a wavelength in vacuum by a refractive index, so that a diffraction angle is correspondingly reduced. However, after the light is emitted from the substrate glass into the air, according to Fresnel refraction law, the diffraction angle will increase according to the proportion of the refractive index, such that the diffraction angle in the air is substantially independent of the refractive index of the medium in the device. Therefore, in the pixel structure shown in FIG. 1, the diffraction effect of the red subpixel is most significant, and the red light of the red pixel is most likely to be transversely diffused and mixed into the light of the adjacent pixel. In addition, in the relater art, the planar arrangement of the subpixels in the pixel is typically implemented in an RGB manner, the mono-color subpixels each have a flat rectangular shape, and the light transmission aperture in a direction along a short edge of the subpixel is the smallest for the light. Accordingly, the diffraction in this direction becomes more serious, and in turn the diffraction effect of the red light further blurs the image.

SUMMARY

At least one of embodiments of the present disclosure provides an OLED display panel and a display apparatus to reduce deterioration on a display image of the display panel caused by a diffraction effect of a subpixel with a longer wavelength and improve display effect of the OLED display panel.

A first aspect of the present disclosure provides an OLED display panel including: a substrate; and a plurality of pixels forming a pixel array on the substrate, wherein each pixel includes a plurality of subpixels, and each subpixel includes an organic light-emitting element and a color filter structure covering the organic light-emitting element. The plurality of the subpixels form a subpixel array. The subpixel array includes N kinds of the color filter elements that are transparent in different color bands, where N≥2. The N kinds of the color filter elements include a kind of the color filter element that is transparent in a first color. Except a periphery of the subpixel array, every M color filter elements of the first color abut each other to form a seamless color filter block, where M≥2. In a second aspect of the present disclosure, a display apparatus comprising the OLED display panel according to the first aspect is disclosed.

In a third aspects of the present disclosure, each pixel includes a subpixel of the first color and at least two subpixels of different colors that are abutted with the subpixel of the first color. In addition, the subpixel of the first color emits light in a longest average wavelength among all the subpixels in the pixel. Therefore, color mixing between two adjacent pixels caused by diffraction of long wavelength light is minimized.

DESCRIPTION OF EMBODIMENTS

The present disclosure is described below in further detail with reference to the accompanying drawings and embodiments. It should be understood that the specific embodiments described herein are merely intended to explain the present disclosure, rather than limiting the present disclosure. In addition, it should also be noted that, for ease of description, only a partial structure related to the present disclosure, rather than the entire structure thereof, is shown in the accompanying drawings.

Figure 4:
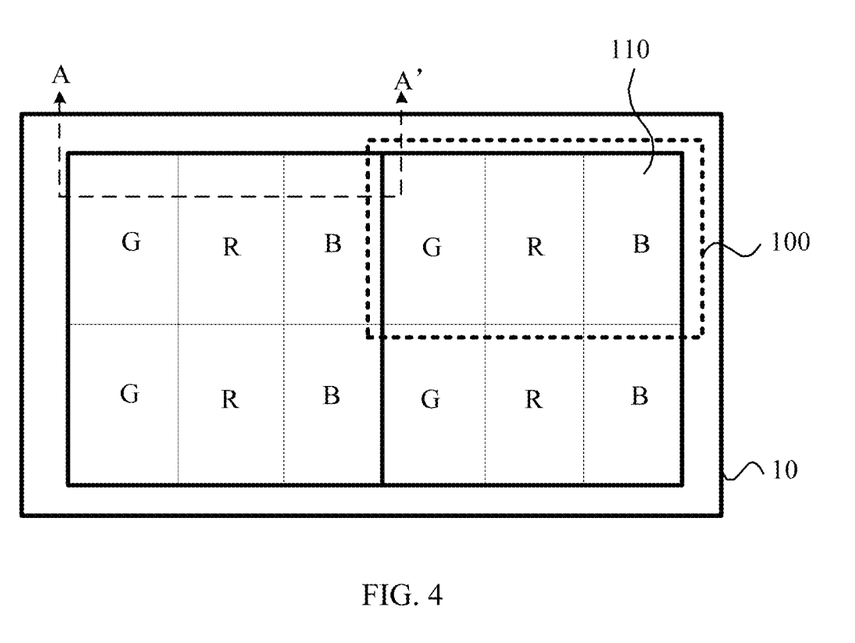
FIG. 4 illustrates a pixel layout of an OLED display panel according to an embodiment of the present disclosure.
Figure 5:
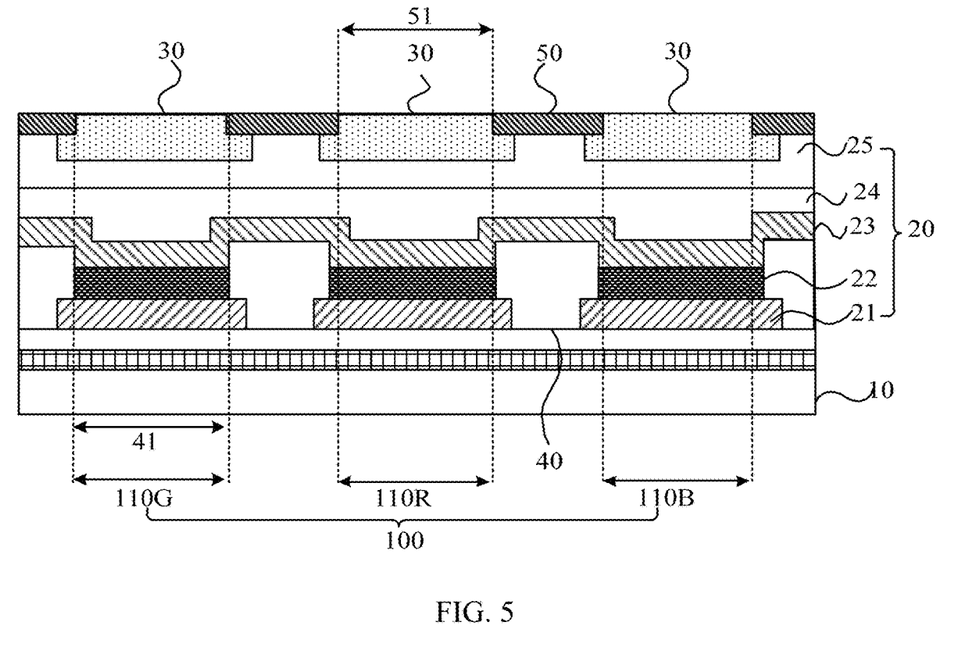
FIG. 5 illustrates a sectional view along the line A-A' as indicated in FIG. 4.

In view of the technical problems as described above, the present disclosure discloses an OLED display panel according to various embodiments. FIG. 4 illustrates a pixel layout of an OLED display panel according to an embodiment of the present disclosure. FIG. 5 illustrates a schematic sectional view along the line A-A' as indicated in FIG. 4. As shown in FIGS. 4 and 5, the OLED display panel includes a substrate 10 and a plurality of pixels 100 forming a pixel array on the substrate 10. Each of the pixels 100 includes a subpixel group that further includes at least three subpixels 110 in different colors, each of which includes an organic light-emitting element 20 and a color filter structure 30 covering the organic light-emitting element 20. Each of the subpixel groups includes a first subpixel that emits light in a first color. The first subpixel poses the longest wavelength in the subpixel group, and is arranged between the rest subpixels of the same subpixel group.

As illustrated in FIGS. 4 and 5, each pixel 100 comprises a subpixel group that includes subpixels of three primary colors (RGB), 110R, 110G and 110B. The red subpixel 110R is the first subpixel that emits red light with the longest wavelength in the subpixel group. Also shown in FIG. 4 and FIG. 5, the first subpixel, i.e. the red subpixel in this case, is physically sandwiched by other subpixels in the same subpixel group, therefore is distanced from adjacent pixel region. Benefiting from this layout arrangement, color mixing and image blurring caused by optical diffraction particularly by long wavelength light are minimized.

It should be noted that, in various embodiments of the present disclosure, the subpixels of different pixels may be the same as or different from each other in the number, the color, the arrangement and the like, and the present disclosure is not intended to be limited thereto.

Figure 6:
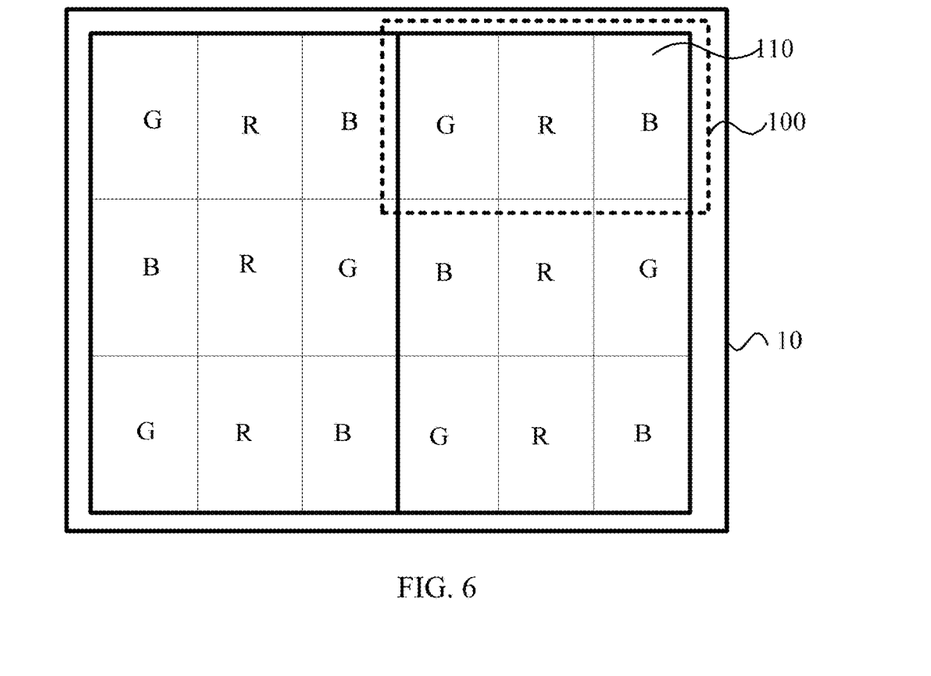
FIG. 6 illustrates a pixel layout of another OLED display panel according to an embodiment of the present disclosure.

Further, FIG. 4 illustrates that the arrangement of subpixels in a first row of pixels is the same as that of subpixels in a second row of pixels. Alternatively, as shown in FIG. 6, the arrangements of subpixels in odd rows of pixels may be configured to be same with each other, and the arrangements of subpixels in even rows of pixels may be configured to be same with each other, provided that a first subpixel emitting light in a first color is arranged adjacent to at least two subpixels of other colors in the same subpixel group.

In an embodiment, with reference to FIGS. 4 and 5, at least two long sides of the first subpixel are arranged adjacent to the two subpixels of other colors in the same subpixel group.

According to Fraunhofer diffraction theory, a spread angle of a bright spot, i.e., the Airy disc, at a center of a diffraction pattern is directly proportional to a wavelength of light and inversely proportional to a light transmission aperture of the subpixel. As shown in FIGS. 4 and 5, when the subpixels 110 of different colors are arranged in a strip shape or a separate rectangle shape, a light transmission aperture between two long sides of the subpixels 110 of different colors is smaller. In this case, since the first subpixel in each subpixel group has the longest wavelength, a serious diffraction will occur on both sides of each of the at least two long side of the first subpixel. Such diffraction occurring on both sides of each of the at least two long sides of the first subpixel would result in blurry display images on the OLED display panel. The at least two long sides of the first subpixel are arranged adjacent to the two subpixels of other colors in the same subpixel group. Therefore, the adjacent pixels of other colors can be avoided from being affected by the diffracted light generated on both sides of each of the at least two long sides of the first subpixel with the longest wavelength, thereby reducing the image blurring effect caused by the diffraction effect occurring in the first subpixel, and improving the display effect of the OLED display panel.

Figure 7:
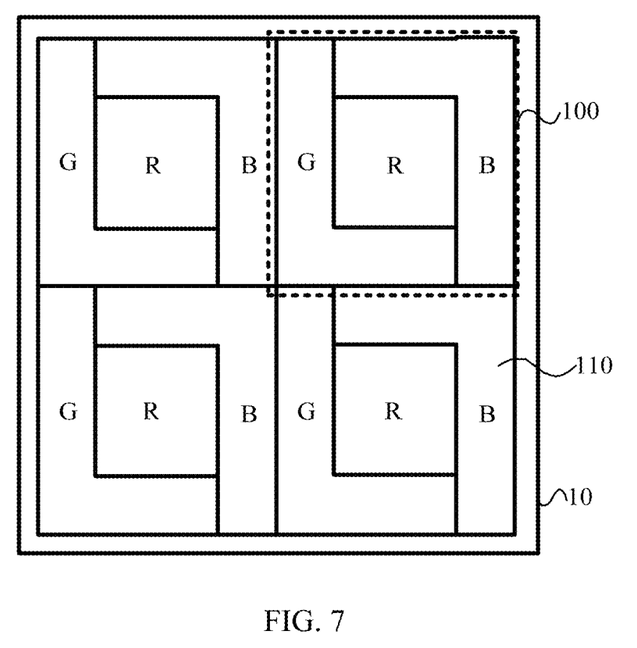
FIG. 7 illustrates a pixel layout of further another OLED display panel according to an embodiment of the present disclosure.

FIG. 7 illustrates a pixel layout of further another OLED display panel according to an embodiment of the present disclosure, based on the embodiments as described above. As shown in FIG. 7, a first subpixel emitting light in a first color is arranged adjacent to at least two subpixels of other colors in the same subpixel group of each of the plurality of pixel 100.

The first subpixel is arranged to be adjacent to the at least two subpixels of other colors in the same subpixel group. In this way, a display effect of the display panel can be avoided from being affected by diffraction occurring on both sides of each of short sides of the first subpixel.

Figure 8:
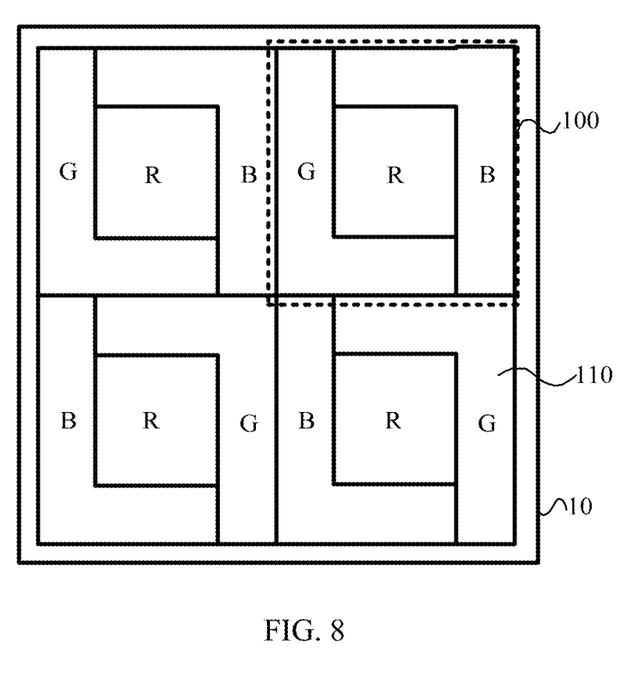
FIG. 8 illustrates a pixel layout of still another OLED display panel according to an embodiment of the present disclosure.

FIG. 7 illustrates an arrangement in which the first subpixel is arranged adjacent to the subpixels of other colors in the same subpixel group. It should be noted that other arrangements may be employed. For example, the arrangement of subpixels of other colors in each of the plurality of pixels 100 shown in FIG. 8 is the same as that shown in FIG. 7, expect that the arrangement of the subpixels of other colors in odd rows of pixels is different from that of the subpixels of other colors in even rows of pixels.

The relevant descriptions and analysis in the embodiments as described above are provided in relation to a typical chromaticity space of three primary colors RGB. The same concept is also applicable to other chromaticity spaces, such as a supplementary chromaticity space of the three primary colors RGB, which is commonly used in a dye industry, i.e., CMYK chromaticity coordinates. Specifically, the supplementary chromaticity space is composed of cyan (CYAN), yellow (YELLOW), magenta (MAGENTA) and black. In an electronic display screen, a CMY chromaticity system is formed by removing the chromaticity coordinates of a black dye. In the RGB chromaticity coordinates, CYAN=G128+B128, MAGENTA=R228+B127, and YELLOW=R247+G171. These relationships also represent a mapping from the RGB chromaticity space to the CMY chromaticity space. Among the three supplementary colors of RGB, a magenta color is a mixture of a large part of a red color and a small part of a blue color and has the longest wavelength. A cyan color is a mixture of a half green color and a half blue color and has the shortest wavelength, and a yellow color has a moderate wavelength. In fact, there are few pure red, green, and blue colors in the nature, and most of the colors are supplementary colors of the three primary colors of red, green, and blue, i.e., cyan, magenta, yellow, and a mixture thereof (also referred to as an intermediate color). For these supplementary colors, the yellow color occupies a considerable component. Furthermore, in existing broadcast television signals, yellow signals are generated most frequently and cyan signals are also generated frequently. Therefore, the first subpixel is not limited to the red subpixel since there are various types of light of different colors in the nature. Thus, in following embodiments, a first color of light emitted from a first subpixel and a composition of subpixels in a subpixel group of each of the plurality of pixels are determined based on subpixels constructed in different chromaticity spaces.

In an embodiment, the first color is one of red, magenta, and white colors.

When a pixel includes a subpixel group that is composed of red, green, and blue subpixels in the chromaticity space of the three primary colors RGB, as shown in FIG. 4, the first subpixel is a red subpixel. Alternatively, when a pixel includes a subpixel group that is composed of cyan, magenta, and yellow subpixels in the supplementary chromaticity space of the three primary colors RGB as shown in FIG. 9, a first subpixel emitting light in a first color is a magenta subpixel.

In an embodiment, as shown in FIG. 4, each of the plurality of pixels 100 includes the subpixel group that further includes red (R), green (G), and blue (B) subpixels.

Figure 9:
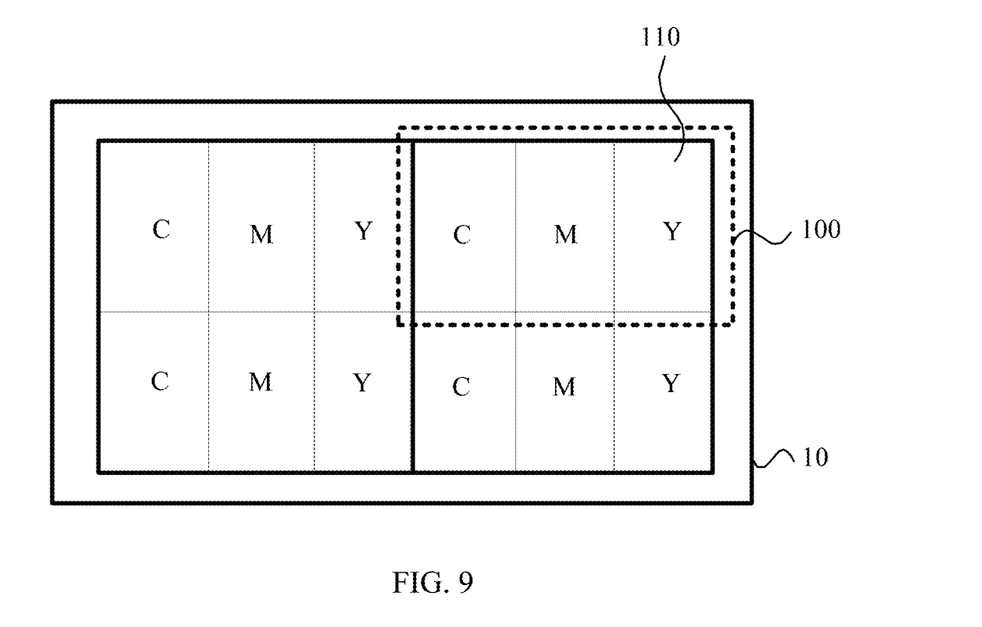
FIG. 9 illustrates a pixel layout of yet another OLED display panel according to an embodiment of the present disclosure.
Figure 10:
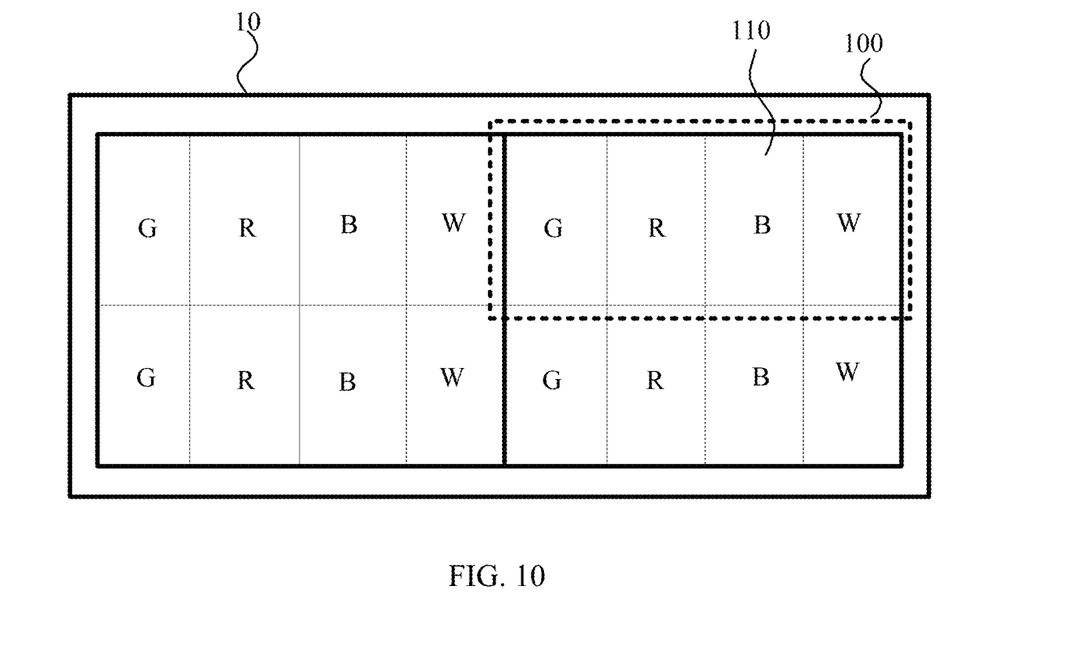
FIG. 10 illustrates a pixel layout of further another OLED display panel according to an embodiment of the present disclosure.

In another embodiment, as shown in FIG. 9, each of the plurality of pixels 100 includes the subpixel group that further includes magenta (M), cyan (C), and yellow (Y) subpixels. In a further embodiment, as shown in FIG. 10, each of the plurality of pixels 100 includes a subpixel group that further includes red (R), green (G), blue (B), and white (W) subpixels.

It should be noted that the subpixel group of the pixel may include red, green, and blue subpixels in the chromaticity space of the three primary color RGB, or red, green, blue, and white subpixels. Alternatively, the subpixel group of the pixel may also include magenta, cyan, and yellow subpixels in the supplementary chromaticity space of the three primary colors RGB.

Figure 11:
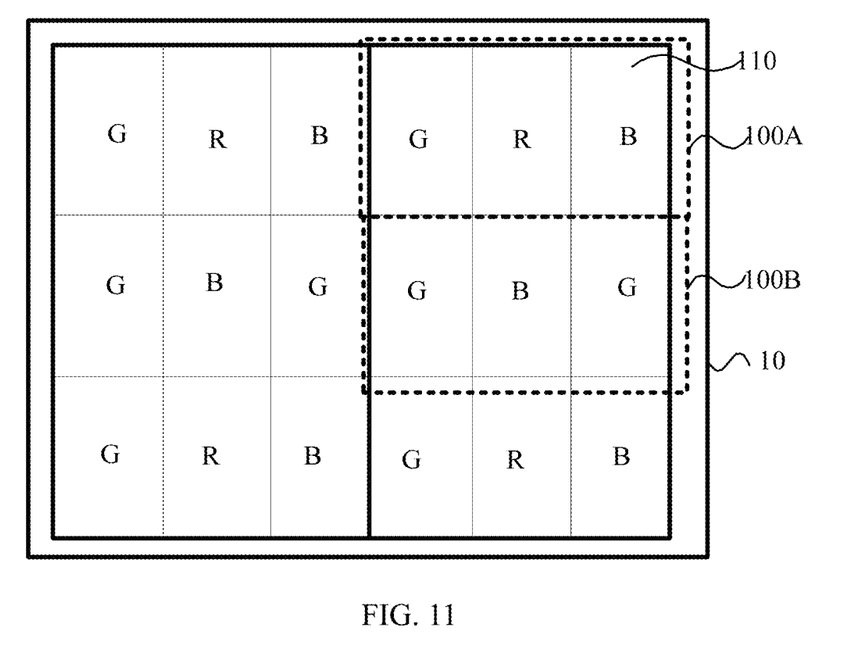
FIG. 11 illustrates a pixel layout of yet another OLED display panel according to an embodiment of the present disclosure.
Figure 12:
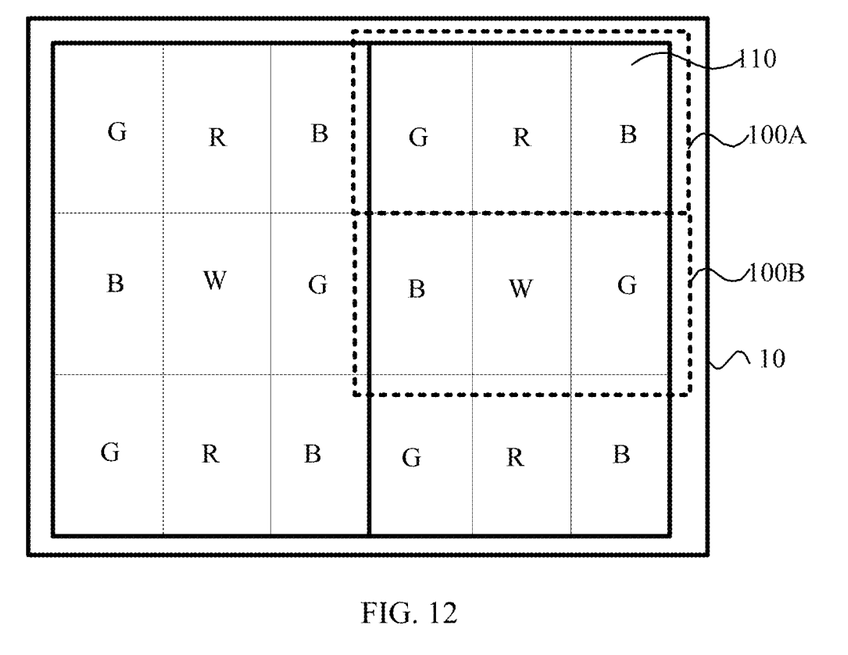
FIG. 12 illustrates a pixel layout of still another OLED display panel according to an embodiment of the present disclosure.

When the subpixel groups of the pixels include red, green and blue subpixels in the chromaticity space of the three primary colors RGB, the red subpixels are arranged on every other row. In this case, if a row of pixels each include red subpixels, the red subpixel of each subpixel group is arranged at a middle position in the respective subpixel group. A blue or green subpixel of each subpixel group, instead of a red subpixel, is arranged at a middle position in the respective subpixel group in an adjacent row of pixels that do not include a red subpixel. As shown in FIG. 11, each of a plurality of pixels 100A in odd rows includes a subpixel grout that further includes a red subpixel, a green subpixel, and a blue subpixel, and each of a plurality of pixels 100B in even rows includes a subpixel grout that further includes two green subpixels and a blue subpixel. As shown in FIG. 12, each of a plurality of pixels 100A in odd rows includes a subpixel grout that further includes a red subpixel, a green subpixel, and a blue subpixel, and each of a plurality of pixels 100B in even rows includes a subpixel grout that further includes a white subpixel, a green subpixel, and a blue subpixel.

Figure 13:
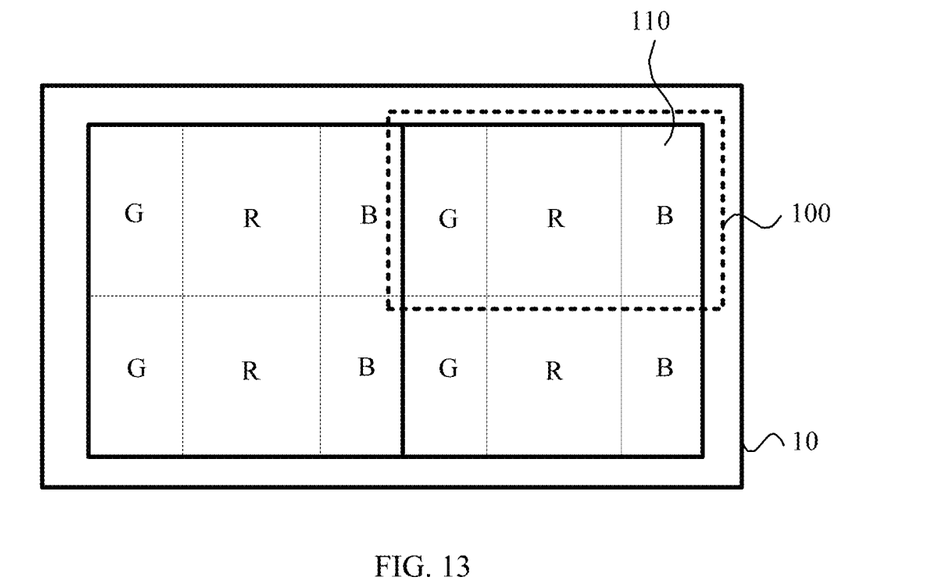
FIG. 13 illustrates a pixel layout of further another OLED display panel according to an embodiment of the present disclosure.

FIG. 13 illustrates a pixel layout of further another OLED display panel according to an embodiment of the present disclosure. As shown in FIG. 13, each of a plurality of pixels 100 includes a subpixel group that further includes three subpixels 110 in different colors. A first subpixel emitting light in a first color includes a light transmission area that is the largest one among the subpixels of the same subpixel group.

According to Fraunhofer diffraction theory, a spread angle of a bright spot, i.e., the Airy disc, at a center of a diffraction pattern is directly proportional to a wavelength of light and inversely proportional to a light transmission aperture of the subpixel. When the light transmission aperture is smaller and the wavelength is longer, a diffraction effect occurring in the subpixel is more serious. The light emitted from the first subpixel poses the longest wavelength in the subpixel group. Further, the first subpixel includes a light transmission area that is the largest one among the subpixels of the same subpixel group. Accordingly, the light transmission aperture of the first subpixel is larger than that of each of the subpixels of other colors of the same subpixel group, thereby reducing optical diffraction occurring in the first subpixel when passing through the respective color filter structure.

Further, when a distance between a color filter structure and an organic light-emitting element of a respective subpixel is short enough with respect to a light transmission aperture of the same subpixel, there is no gap between the adjacent subpixels or a black matrix between the adjacent subpixels is formed by superposing the color filter structures on the adjacent subpixels.

In an embodiment, a light transmission area of the color filter structure 30 of the subpixel 110 is positively correlated with an average wavelength of the light emitted from the subpixel 110.

The average wavelength of the light emitted from one of the subpixels 110 is defined below. The light emitted from the one subpixel is not a monochromatic light, and generates an extended spectrum with a predetermined width, such as a spectrum of red, green or blue light. Alternatively, the light emitted from the one subpixel generates a spectrum with two or more peaks, such as supplementary colors of the three primary colors RGB including cyan, magenta, and yellow colors. In view of the above, the average wavelength herein refers to a weighted average of a luminous flux. If the average wavelength is expressed by an integral formula, a calculation formula of the average wavelength satisfies:

$$\overline{\lambda} = \frac{\int_0^\infty [\lambda \cdot \Phi(\lambda)] d\lambda}{\int_0^\infty \Phi(\lambda) d\lambda}.$$

where $\overline{\lambda}$ denotes the average wavelength, and $\Phi(\lambda)$ denotes a spectral distribution of the luminous flux in which the wavelength is defined as a parameter.

When the light transmission area of the color filter structure of the subpixel is configured to be positively correlated with the average wavelength of the light emitted from the subpixel, the optical diffraction occurring in the subpixels of different colors when passing through the color filter structure has minimum influence on the display effect of the OLED display panel.

In an embodiment, the first subpixel may be in a circular shape, an elliptical shape, or an N-sides polygonal shape, where N≤8.

The first subpixel may be in the circular shape or the elliptical shape. Alternatively, the first subpixel may be in the N-sides polygonal shape, where N≤8. An embodiment will be described below, in which the first subpixel is in an N-sides polygon shape, where N≤8.

Figure 14:
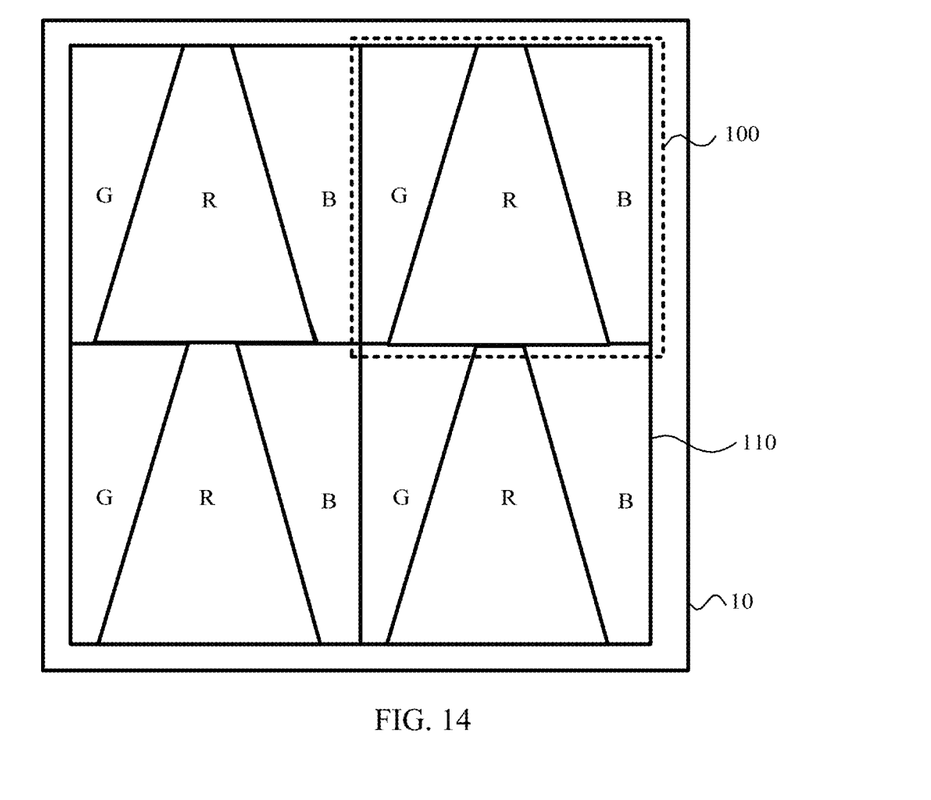
FIG. 14 illustrates a pixel layout of yet another OLED display panel according to an embodiment of the present disclosure.

In view of the embodiments as described above, FIG. 14 illustrates a pixel layout of yet another OLED display panel according to an embodiment of the present disclosure. As shown in FIG. 14, a first subpixel emitting light in a first color of the subpixel group in each of the plurality of pixels 100 is in a trapezoidal shape, and each of the rest subpixels of other colors in the same subpixel group are in a trapezoidal shape. At least some of beveled edges of the trapezoidal subpixels of other colors are arranged adjacent to a boundary of the first subpixel in the same subpixel group.

As shown in FIG. 14, for each of the subpixel groups, the first subpixel is in the trapezoidal shape, and the beveled edges of the trapezoidal subpixels of other colors are arranged adjacent to beveled edges of the first subpixel in the trapezoidal shape in the same subpixel group. Therefore, diffracted light can be diffused to the adjacent subpixels after the first subpixel is diffracted, thereby compensating the diffraction occurring in the first subpixel through the adjacent subpixels, and reducing a blurring effect caused by the diffraction effect occurring in the first subpixel on the display image of the display panel. Further, since the trapezoidal subpixel of other color includes an increased light transmission area, it is possible to reduce the influence of the diffraction occurring in the subpixels of other colors on the display effect of the OLED display panel.

Figure 15:
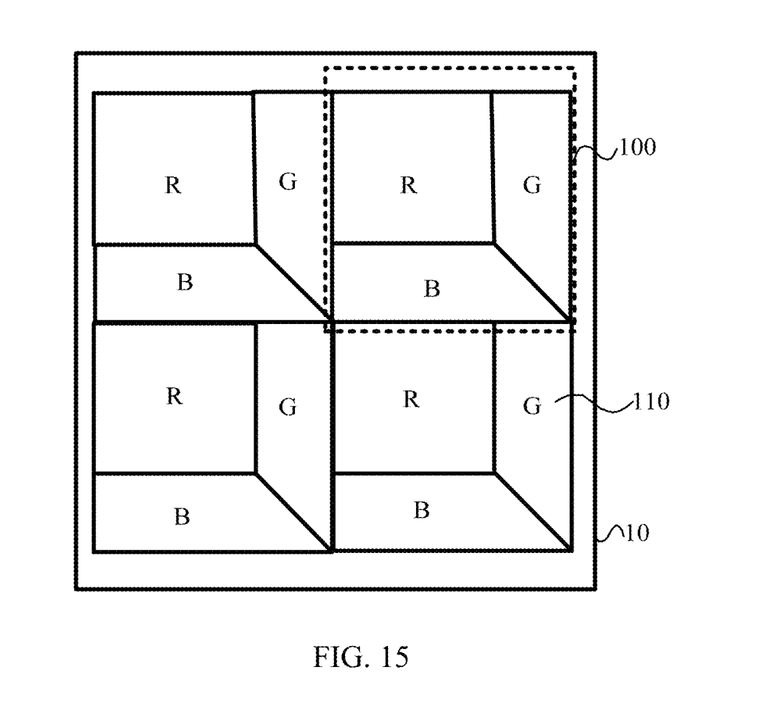
FIG. 15 illustrates a pixel layout of still another OLED display panel according to an embodiment of the present disclosure.
Figure 16:
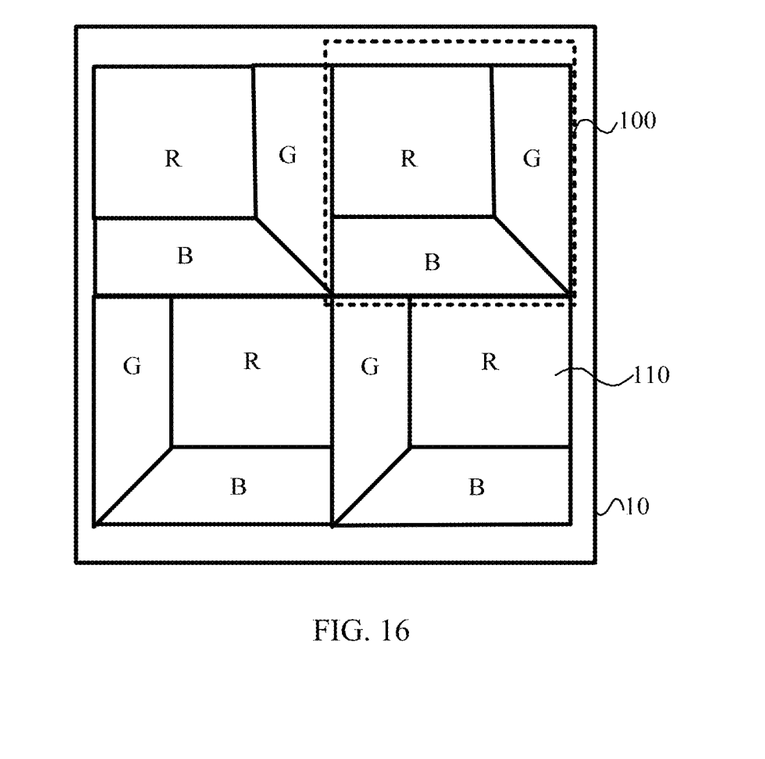
FIG. 16 illustrates a pixel layout of further another OLED display panel according to an embodiment of the present disclosure.
Figure 17:
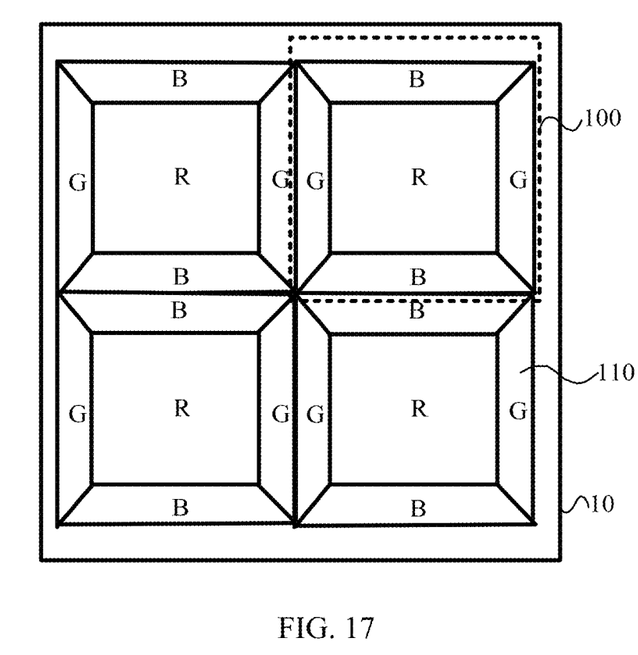
FIG. 17 illustrates a pixel layout of yet another OLED display panel according to an embodiment of the present disclosure.

In an embodiment, as shown in FIG. 15 to FIG. 17, each of the plurality of pixels 100 includes a subpixel group that further includes at least three subpixels 110. A first subpixel emitting light in a first color is in a rectangular shape, and each of the rest subpixels of other colors in the same subpixel group is in a trapezoidal shape.

FIG. 15 to FIG. 17 illustrate a pixel layout in which, for the subpixel group of each of the plurality of pixels 100, the first subpixel is in the rectangular shape and each of the rest subpixels of other colors in the same subpixel group is in the trapezoidal shape. As shown in FIGS. 15 and 16, the first subpixel is in the rectangular shape, and each of the rest subpixels of other colors in the same subpixel group is in a right-angled trapezoidal shape. In this case, short sides of the rest subpixels of other colors are increased, thereby reducing the diffraction effect occurring in the rest subpixels of other colors. Alternatively, the first subpixel may be in the rectangular shape, each of the rest subpixels of other colors in the same subpixel group may be in a beveled trapezoidal shape, and all sides of the first subpixel may be arranged adjacent to the subpixels of other colors in the same subpixel group, as shown in FIG. 17.

Alternatively, as shown in FIG. 7 or FIG. 8, the first subpixel is in a rectangular shape, and the rest subpixels of other colors in the same subpixel group are in an L shape and arranged surrounding the first subpixel.

It should be noted that when the first subpixel is in the rectangular shape, each of the rest subpixels of other colors in the same subpixel group may be in the trapezoidal shape or L shape, as shown in FIG. 7 or FIG. 8. Further, the subpixels of other colors in the same subpixel group may be arranged in other manners, which is not limited to the embodiments of the present disclosure as described.

Figure 18:
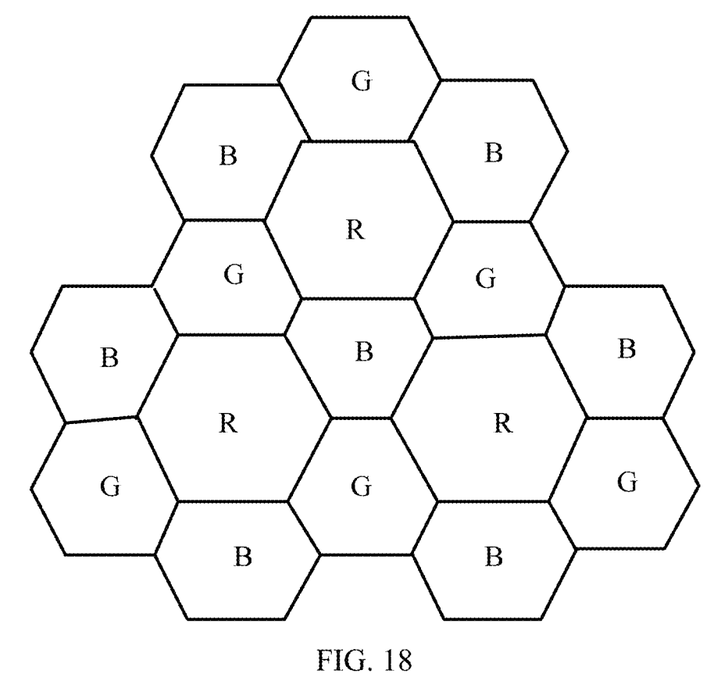
FIG. 18 illustrates a pixel layout of still another OLED display panel according to an embodiment of the present disclosure.

In view of the embodiments as described above, FIG. 18 illustrates a pixel layout of still another OLED display panel according to an embodiment of the present disclosure. As shown in FIG. 18, each of subpixels in a subpixel group is in a six-sides polygonal shape, thereby forming a honeycomb-like array.

As shown in FIG. 18, when a first subpixel emitting light in a first color in the subpixel group is in the six-sides polygonal shape, the subpixels may be arranged in the honeycomb-like array. The subpixels arranged in the honeycomb-like array may increase light output of the OLED display panel, thereby improving the display effect of the OLED display panel.

It should be noted that, in FIG. 14 to FIG. 18, a description will be set forth in which the first subpixel is in an N-sides polygonal shape, where N≤8. Further, the first subpixel is a red subpixel, and the subpixels of other colors include blue subpixels and green subpixels. Alternatively, the first subpixel may be a magenta subpixel, and the subpixels of other colors may include cyan subpixels and yellow subpixels. In this case, the specific arrangement is the same as the case where the first subpixel is the red subpixel and the subpixels of other colors include blue subpixels and green subpixels, and thus the details thereof are omitted.

Further, all of the above embodiments are illustrative in which the plurality of pixels include red, green, and blue subpixels or include magenta, yellow, and cyan subpixels. Alternatively, the subpixels may include subpixels of other colors, and the arrangement of the above subpixels is only illustrative. The subpixels may be arranged in other manners, and thus the present disclosure is not limited thereto.

In an embodiment, with reference to FIG. 5 again, the organic light-emitting element 20 includes an anode 21, a light-emitting layer 22, a cathode 23, an encapsulation layer 24 and a planarization layer 25 sequentially stacked on the substrate 10. Each of the plurality of the pixel 100 further includes a pixel definition layer 40, which is formed on the anode 21 and is provided with a first opening 41 to expose a partial area of the anode 21. The light-emitting layer 22 is located within the first opening 41.

Figure 19:
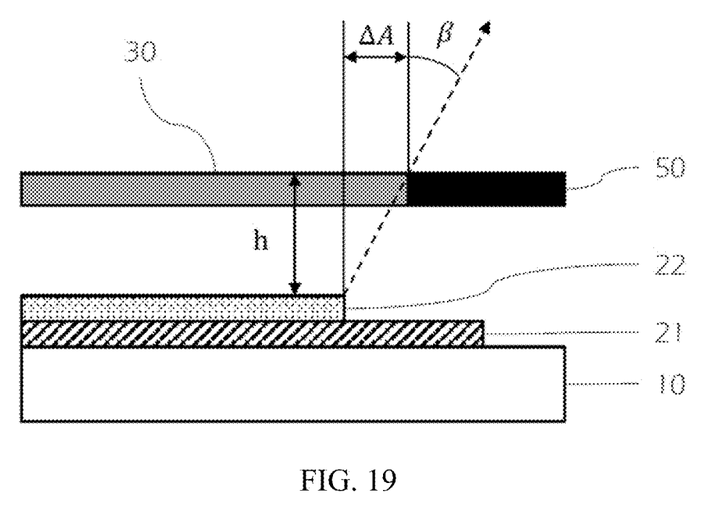
FIG. 19 illustrates a sectional view of further another OLED display panel according to an embodiment of the present disclosure.

Referring to FIG. 19, it illustrates a sectional view of further another embodiment of the present disclosure. Optical diffraction will occur whenever the light transmission from the light-emitting layer is hindered by a finite optical aperture such as the one defined by the black matrix 50. Two geometric parameters in this sectional view, a vertical distance h from light-emitting layer to the color filter surface, and an overhanging length of color filter beyond the edge of the light-emitting layer Δ A, will significantly change the effects of the optical diffraction. Larger h, or smaller Δ A, or in the worst case a negative Δ A value, tend to hinder light transmission more significantly. A preferable geometric structure as an embodiment of the present disclosure is to make the vertical distance h less than an average wavelength of the light emitted from the first subpixel, and/or Δ A>0.

During manufacturing a silicon-based OLED display panel, an overall thickness of the anode 21, the light-emitting layer 22, the cathode 23, the encapsulation layer 24, and the planarization layer 25 on the subpixels of different colors can be made substantially same with each other in order to simplify manufacturing process. However, since the light emitted from the first subpixels poses the longest wavelength in the subpixel group, the diffraction occurring in the first subpixel is most significant. During a preparing process, a vertical distance between the light-emitting layer and the color filter structure of the subpixel is configured to be less than the average wavelength of the light emitted from the first subpixel, such that the diffraction occurring in the first subpixel is reduced. Accordingly, the diffraction occurring in the subpixels of different colors after passing through the color filter structure 30 has minimum influence on the display effect of the OLED display panel.

It should be noted that when the diffraction occurring in the subpixels of other colors in the OLED display panel is significant, that is, in an extreme case where a significant diffraction is generated after the light emitted from all the subpixels passes through the color filter structure, the vertical distance between the light-emitting layer and the color filter structure of the subpixel is configured to be less than the shortest one of the average wavelengths of the lights emitted from all of the subpixels of the same subpixel group. Accordingly, the diffraction generated after the subpixel of each color passes through the color filter structure is reduced.

Further, the vertical distance between the light-emitting layer and the color filter structure of the subpixel may be configured to be less than the average wavelength of the light emitted from the green subpixel. When the red subpixels and the green subpixels in the display panel are diffracted, the diffraction generated after the red subpixels and the green subpixels pass through the color filter structure is reduced.

In an embodiment, with reference to FIG. 5 again, the OLED display panel further includes a black matrix 50 located on a side of the organic light-emitting element 20 facing away from the substrate 10 and provided with a plurality of second openings 51. In this embodiment, an opening angle β is formed from the edge of the first opening to the edge of the second opening in each subpixel, as shown in FIG. 19. The opening angel satisfies the following equation:

$$\beta = \operatorname{arctg}(\Delta A / h) \geq 15°,$$

where β denotes the opening angle, Δ A denotes the overhanging length of color filter beyond the edge of the light-emitting layer 22, and h denotes the vertical distance between the light-emitting layer 22 and the color filter structure 30 of the subpixel.

The diffraction occurring in the OLED display panel is caused by the fact that the light emitted from the subpixels is obstructed in the transmission path. Therefore, the diffraction may be alleviated if the obstruction to a natural transmission of the light emitted from the organic light-emitting element can be reduced. In order not to obstruct the transmission path of the light emitted from the organic light-emitting element as much as possible, it can be learned through calculation and analysis that when the opening angle from the edge of the first opening to the edge of the second opening in each subpixel is greater than or equal to 15 degrees, the transmission path of the light emitted from the organic light-emitting element will not be restricted by the light transmission aperture of the color filter structure of the subpixel, thereby avoiding occurrence of diffraction.

Further, the orthogonal projection of each second opening 51 on the substrate 10 may be overlapped with that of the respective light-emitting layer 22 on the substrate 10, and a size of each second opening 51 in the black matrix 50 may be changed. Thus, the diffraction generated after the subpixel of each color passes through the color filter structure is reduced, regardless of a relationship between the vertical distance between the light-emitting layer and the color filter structure of the subpixel and the average wavelength of each subpixel.

It should be noted that, in the above descriptions, each of the openings of the black matrix 50 is treated as circular aperture, in which Fraunhofer circular aperture diffraction occurs. However, other geometric shapes of the openings of the black matrix are feasible as well. In addition, a black matrix can be formed by superimposing two adjacent color filters in different color bands along their border, so as to block all visible light. Therefore, in all of the drawings of the present disclosure, the black matrix mentioned in the description and claims represents any structure or material constituting the structure defining light passing windows. Phrases such as "opening of the black matrix", "light transmission aperture", and "light transmission area" represent the light passing windows equivalently.

The present disclosure provides a display apparatus including the OLED display panel described in any one of the embodiments herein. The display apparatus may be employed for a computer monitor, a television set, a display unit on a smart wearable device, or the like, and the present disclosure is not intended to be limited thereto.

It should be noted that the foregoing embodiments are merely preferred embodiments of the present disclosure. It should be understood by those skilled in the art that the present disclosure is not limited to the specific embodiments described herein, and various modifications, combinations, and substitutions may be made by those skilled in the art without departing from the scope of the present disclosure. The scope of the present disclosure is defined by the appended claims.

What is claimed is:

1. An organic light-emitting diode (OLED) display panel, comprising:
    a substrate; and
    a plurality of pixels forming a pixel array on the substrate, wherein each of the plurality of pixels comprises a subpixel group that further comprises at least three subpixels emitting light in different colors and each subpixel comprises an organic light-emitting element and a color filter structure covering the organic light-emitting element,
    wherein the subpixel group comprises a first subpixel that emits light in a first color which poses the longest wavelength in the subpixel group, the first subpixel is arranged adjacent to the rest subpixels of the subpixel group,
    wherein a light transmission aperture of the first subpixel is larger than a light transmission aperture of each of the subpixels of other colors of the same subpixel group, the light transmission aperture being defined by a black matrix arranged around the color filter structure, and
    wherein two first subpixels of two adjacent subpixel groups are arranged side by side without a black matrix between them.

2. The OLED display panel according to claim 1, wherein at least two long sides of the first subpixel are arranged adjacent to at least two subpixels of other colors in the same subpixel group.

3. The OLED display panel according to claim 1, wherein the first subpixel is arranged adjacent to at least two subpixels of other colors of the same subpixel group.

4. The OLED display panel according to claim 1, wherein the first color is a red color, a magenta color, or a white color.

5. The OLED display panel according to claim 1, wherein the subpixel group comprises a red subpixel, a green subpixel, and a blue subpixel.

6. The OLED display panel according to claim 1, wherein the subpixel group comprises a magenta subpixel, a cyan subpixel, and a yellow subpixel.

7. The OLED display panel according to claim 1, wherein the subpixel group comprises a red subpixel, a green subpixel, a blue subpixel, and a white subpixel.

8. The OLED display panel according to claim 1, wherein the first subpixel comprises a light transmission area that is the largest one among the subpixels of the same subpixel group.

9. The OLED display panel according to claim 1, wherein a size of a light transmission area of the color filter structure of the subpixel is positively correlated with an average wavelength of light emitted from the subpixel in a manner that the longer the wavelength, the large the size of the light transmission area.

10. The OLED display panel according to claim 1, wherein the first subpixel is in a circular shape, an elliptical shape, or an N-sides polygonal shape where N≤8.

11. The OLED display panel according to claim 1, wherein the first subpixel is in a rectangular shape, and the rest subpixels in the same subpixel group are in in a trapezoidal shape.

12. The OLED display panel according to claim 1, wherein the first subpixel is in a rectangular shape, and the rest subpixels in the same subpixel group are in an L shape and arranged surrounding the first sub-pixel.

13. The OLED display panel according to claim 1, wherein each of the subpixel in a subpixel group is in a six-sides polygonal shape, forming a honeycomb-like pattern.

14. The OLED display panel according to claim 1, wherein
    the organic light-emitting element comprises an anode, a light-emitting layer, a cathode, an encapsulation layer and a planarization layer sequentially stacked on the substrate; and each of the plurality of the pixel further comprises a pixel definition layer formed on the anode and provided with a first opening that exposes a partial area of the anode, and the light-emitting layer of the organic light-emitting element is located within the first opening.

15. The OLED display panel according to claim 14, further comprising:
the black matrix located on a side of organic light-emitting elements facing away from the substrate, the black matrix being provided with a plurality of second openings,
wherein in each subpixel, an opening angle ($\beta$) from the edge of the first opening to the edge of the second opening is greater than or equal to 15 degrees.

16. The OLED display panel according to claim 1, wherein the organic light-emitting element comprises an anode, a light-emitting layer, a cathode, an encapsulation layer and a planarization layer sequentially stacked on the substrate, and
wherein a vertical distance (h) between the light-emitting layer and the color filter structure of the subpixel is less than the average wavelength of the light emitted from the first subpixel.

17. A display apparatus, comprising the OLED display panel according to claim 1.

\* \* \* \* \*